United States Patent [19]

Wachs

[11] Patent Number: 5,754,942
[45] Date of Patent: May 19, 1998

[54] SATELLITE POWER LEVEL MONITORING SYSTEM AND METHOD USING DIGITAL SIGNAL PROCESSING

[75] Inventor: Marvin R. Wachs, Calabasas, Calif.

[73] Assignee: Hughes Electronics Corporation, El Segundo, Calif.

[21] Appl. No.: 709,314

[22] Filed: Sep. 9, 1996

[51] Int. Cl.⁶ .......................... H04B 7/185; H04B 17/00
[52] U.S. Cl. .................................. 455/9; 455/13.4
[58] Field of Search ................... 455/427, 9, 12.1, 455/13.4, 20, 67.1, 69, 226.1, 226.2

[56] References Cited

U.S. PATENT DOCUMENTS

| | | | |
|---|---|---|---|
| 3,487,169 | 12/1969 | Miyagi | 455/13.4 |
| 5,060,292 | 10/1991 | Ayukawa et al. | 455/13.4 |
| 5,613,197 | 3/1997 | Copeland et al. | 455/12.1 |

*Primary Examiner*—Nguyen Vo
*Attorney, Agent, or Firm*—Terje Gudmestad; Elizabeth E. Leitereg; Michael W. Sales

[57] ABSTRACT

In a satellite transponder architecture employing digital signal processing, a power monitor samples the data stream of carrier frequency samples on board the transponder and computes a power level for each of the carriers. This provides accurate and high frequency resolution power measurements within the communications link. These measurements are useful for computing critical transponder characteristics such as the effective isotropic radiated power (EIRP), receiver sensitivity, uplink sensitivity, operating points and, in a system using a phased array antenna, the total and component powers for each beam. The power monitor eliminates problems associated with external measurement methods, and improves the overall accuracy and reliability.

12 Claims, 5 Drawing Sheets

SATELLITE POWER LEVEL MONITORING SYSTEM AND METHOD USING DIGITAL SIGNAL PROCESSING

BACKGROUND OF THE INVENTION

1. Field of the Invention

This invention relates to monitoring power levels on board a communications satellite, in which the satellite's transponders use digital signal processors to process multi-carrier signals.

2. Description of the Related Art

Communications satellites are used to receive signals from Earth based transmitters, filter, amplify and reroute the signals, and then retransmit the signals to local receivers on the Earth. Because a satellite can cover a wide area of the Earth and can transmit and receive a large number of communication channels simultaneously, satellite communications are well suited for applications such as television, data communications networks, and mobile cellular telephone systems.

FIG. 1 shows a typical communications satellite system for a mobile cellular telephone application. A plurality of carriers, each destined for a mobile terminal, are generated in a gateway terminal 2 which frequency multiplexes the carriers together and transmits them to the satellite 4 via an uplink 6. The satellite 4 receives the multiplexed signals with a receive antenna 8, demultiplexes the carriers individually, and filters, amplifies and routes them to desired downlink beams 10 via a transmit antenna 12. Earth-based mobile terminals 14 are grouped in a plurality of geographically divided coverage regions 16. Each of the mobile terminals 14 receives one or more downlink carrier beams 10 that is directed towards that mobile terminal 14. Because a mobile cellular telephone system is a two-way communications system, the satellite must be able to perform reciprocal operations for transmission from the mobile terminals 14 to the gateway terminal 2. A separate transponder on board the satellite 4 performs the reciprocal operations.

FIG. 1 is only one example of many possible implementations of a satellite communications system; other implementations are also feasible.

FIG. 2 is a simplified block diagram of a conventional transponder employing digital signal processing in a mobile cellular communications satellite in which the satellite's transmit antenna is a phased array antenna comprising N array elements 18a, 18b, 18c, ... 18n. The transponder's uplink antenna 20 receives a plurality of uplink communication carriers 22 which are frequency multiplexed together. A wide-band receiver receives the incoming signals and converts them to baseband signals 24. An analog-to-digital (A/D) converter samples and quantizes the baseband signals 24 and converts them to discrete time samples 26. A digital Fourier transform processor 28 transforms the discrete time samples 26 into discrete frequency samples 30.

The multi-carrier discrete frequency samples 30 are then channelized and filtered digitally. There are many ways to process the signals digitally. In a preferred embodiment, the frequency samples 30 are replicated in a replicator 32 into N identical samples 34a, 34b, 34c, ... 34n. The carrier signals are digitally weighted by multiplying respective predetermined complex weighting coefficients 36a, 36b, 36c, ... 36n by an array of complex multipliers 38a, 38b, 38c, ... 38n. The weighting coefficients 36a, 36b, 36c, ... 36n are each designed to change the amplitude and the phase of each of the carrier signals so that a desired antenna beam pattern can be formed from the individual elements 18a, 18b, 18c, ... 18n. The multiplied frequency-domain signals 40a, 40b, 40c, ... 40n are then passed through respective inverse Fourier transform processors 42a, 42b, 42c, ... 42n that convert the frequency-domain signals to time-domain digital signals 44a, 44b, 44c, ... 44n. These time-domain digital signals are converted in respective digital-to-analog converters (D/A) to analog carrier signals 46a, 46b, 46c, ... 46n. The analog signals 46a, 46b, 46c, ... 46n are each amplified and fed to their respective array elements 18a, 18b, 18c, ... 18n in a phased array transmit antenna.

At the output of the digital Fourier transform processor 28, the carriers are separated in frequency sequentially, and a series of all of the discrete carrier frequencies form a frame. After all carrier frequencies are sampled in a frame, a successive frame samples the carrier frequencies from the first to the last in a repetitive manner. FIG. 3 shows a plot of typical digital Fourier-transformed frequency samples having four carrier frequencies 48a–d in frame 1, 50a–d in frame 2, and 52a–d in frame 3.

Successful operation of a multicarrier satellite communications system requires the proper allocation of transponder power resources amongst the communications carriers present. In addition, knowledge of the total signal power is required to properly set the transponder operating power level. For conventional satellites, knowledge of the signal power in each carrier is deduced from ground based measurements of the received carriers. The power transmitted from the satellite is then computed by means of a link budget computation which accounts for the various gain and loss factors contributing to the satellite to Earth station path. The accuracy of this computation is limited by the assumptions made in this calculation. For conventional satellites, which operate with a multitude of isolated beams, it is impossible to determine the signal power, individually or in composite, from a single Earth station location; multiple measurement Earth stations located in each coverage area are normally required. Another application of the knowledge of carrier power level at the satellite is dynamic uplink power control. An uplink power control system dynamically adjusts the uplink transmitter power to compensate for varying Earth station to satellite path loss resulting from precipitation induced fading.

SUMMARY OF THE INVENTION

In view of the above problems, the present invention provides a system for measuring power levels of individual communication carriers on board a satellite, in which the satellite's transponder uses digital processors to channelize and filter multi-carrier signals, thereby improving the accuracy and reliability of the transponder characterization.

This is accomplished by sampling a data stream of carrier frequency samples in the frequency domain and computing power levels for each of the carriers. This provides accurate and high resolution power measurements within the transponder.

In a preferred embodiment, the digital processor provides a digital power monitor that samples the data stream and computes the mean square power of each carrier's digitized frequency samples. This power monitor is particularly suited to a transponder system described in FIG. 2. The mean square power levels are encoded and telemetered to an Earth station, which calculates the transponder characteristics. A system administrator uses the characterization to control transponder operation and to direct the transmitters to appropriately alter their individual carrier power levels.

Alternately, the digital processor can be programmed to characterize the transponder operation and direct any necessary adjustments.

These and other features and advantages of the invention will be apparent to those skilled in the art from the following detailed description, taken together with the accompanying drawings, in which:

DETAILED DESCRIPTION OF THE INVENTION

The present invention provides a system and method for monitoring power levels for individual carriers on board satellites that use a digital processor to channelize and filter multi-carrier uplink signals. The digitally filtered and channelized signals are then converted to analog signals, amplified and retransmitted to the Earth.

In accordance with the invention, the digitized frequency samples 30 of the carriers from the digital Fourier transform processor 28 are used to compute the instantaneous power of each carrier signal. Because the computed power levels are digital, they can easily be stored in memory registers. Because each carrier's time position in the sequence is known, the power level of each carrier can be sent to its assigned memory register. Successive power level computations for each carrier can be added to the computation currently stored in that carrier's memory register to obtain the total energy for each carrier for a period of measurement time (T). The total energy for each carrier over T is divided by T to obtain the time-averaged power level for that carrier in the following manner:

$$P_c = \frac{1}{T} \sum_{i=1}^{N} V_i^2$$

where $P_c$ is the average power of a carrier over time T, T is the time period of measurements, N is the number of measured samples for each carrier taken in time T, i is the counter for each measured sample, and $V_i$ is the amplitude of the carrier in the $i^{th}$ sample.

Figure 1:
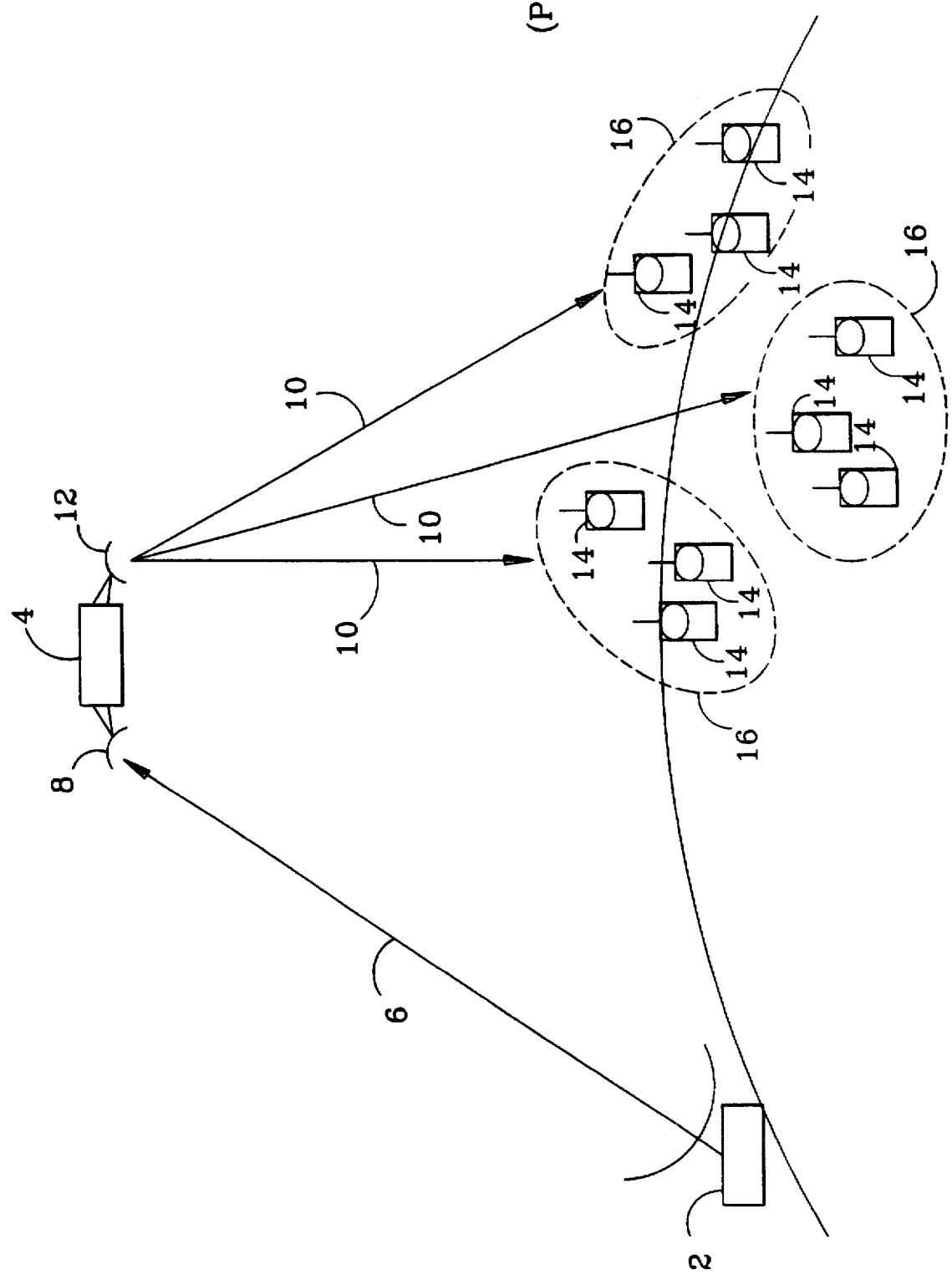
FIG. 1, described above, is a schematic diagram of a known communications satellite system with an uplink beam from a gateway terminal and several downlink beams to several mobile terminals in different coverage regions.
Figure 2:
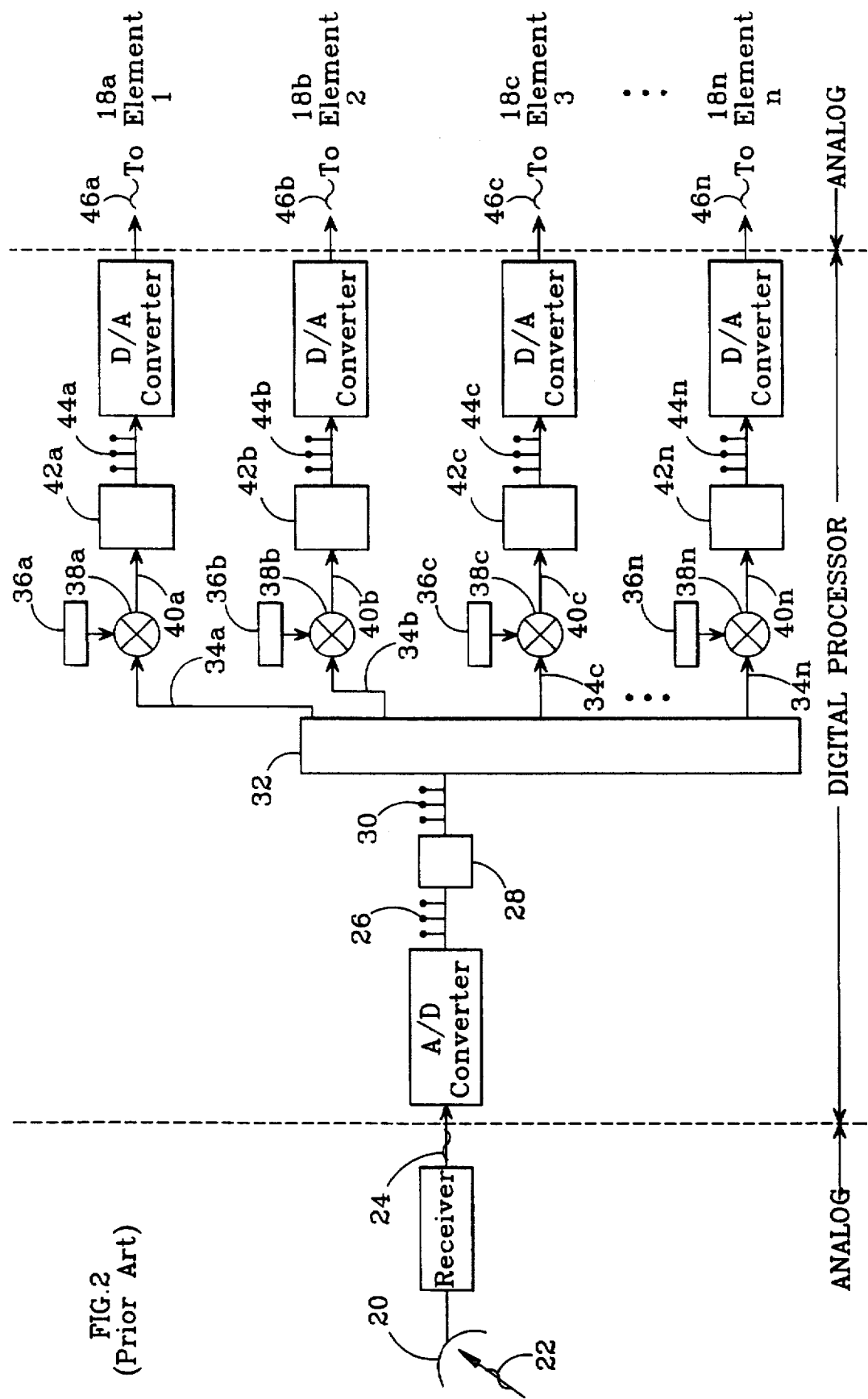
FIG. 2, described above, is a block diagram of a conventional digital processing system in a satellite transponder that uses a phased array transmit antenna.
Figure 3:
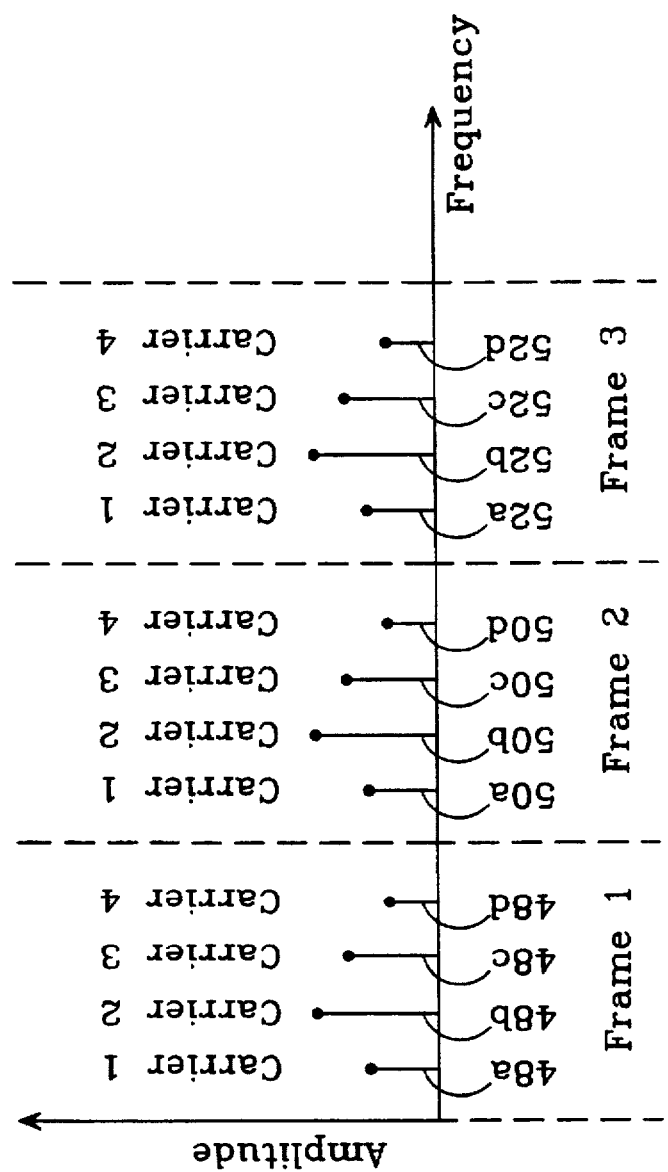
FIG. 3, described above, is a typical plot of discrete carrier signals in the frequency domain after the digitized time samples of the signals have been transformed into the frequency domain by digital Fourier transform.
Figure 4:
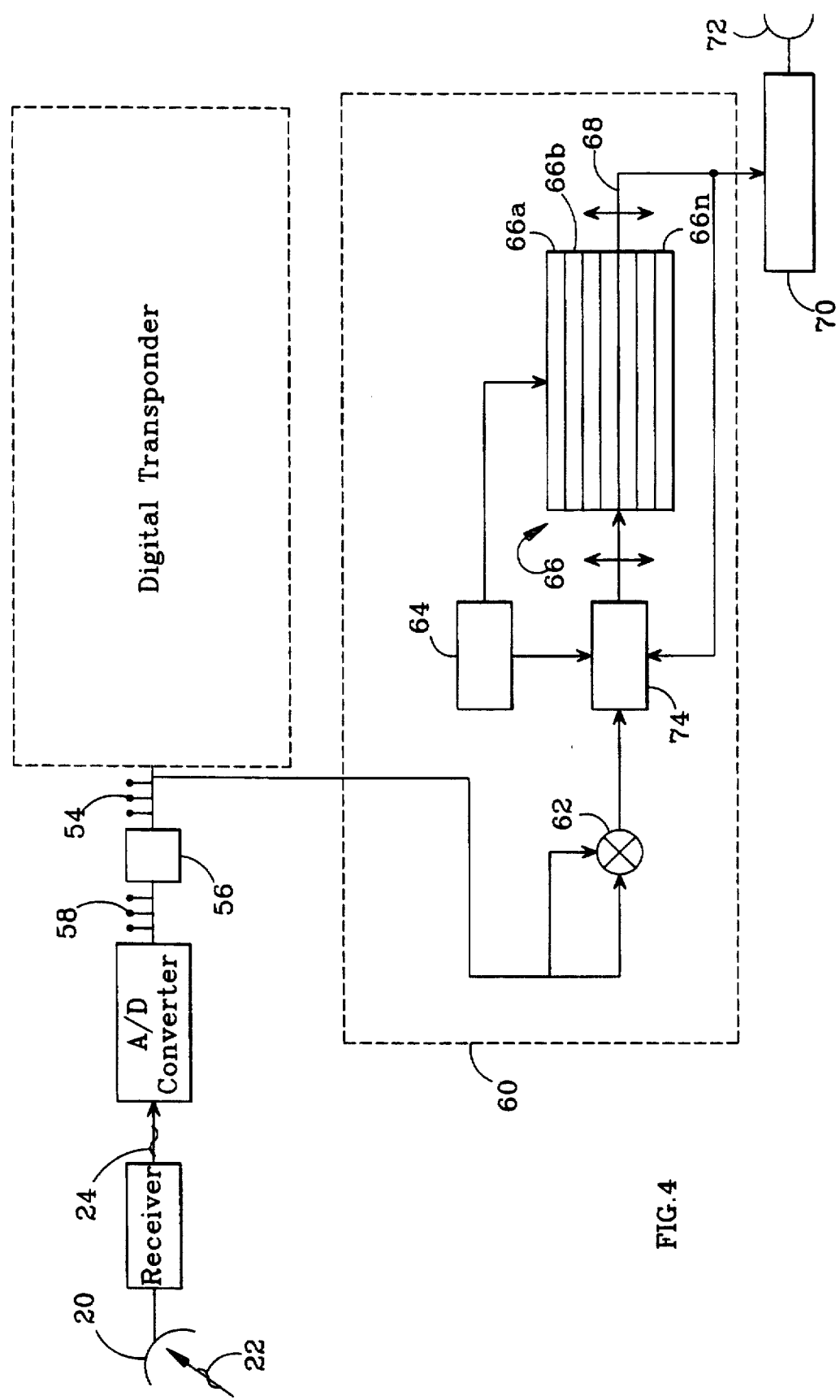
FIG. 4 is a block diagram of a digital processing system in a satellite transponder architecture that uses a phased array antenna, with a system for measuring, computing, and storing the absolute power level of each carrier digitally and transmitting the power data to a telemetry transmit antenna in accordance with the invention.

FIG. 4 shows an implementation of a system 30 for monitoring the power levels of individual carriers on board a satellite. From output 54 of the digital Fourier transform processor 56, the discrete frequency-sampled output waveform 58 is routed to the on board power monitoring system 60 in addition to being routed to the digital transponder, such as the one depicted in FIG. 2. In one embodiment, the amplitude of each carrier frequency sample is squared by multiplying the sample to itself in a multiplier 62. There are other methods for computing power than squaring, and their results are equivalent. A timing clock 64 is synchronized to the arrival of each carrier frequency sample. The individual memory registers 66a, 66b, . . . 66n in a memory register bank 66 each stores the power level of a respective carrier. Before the power measurement begins, all memory registers 66a, 66b, . . . 66n are flushed with zeros. The registers have outputs 68 to a modulator 70 in which the power level data are converted to telemetry RF signals so that the data can be transmitted to an Earth station via a downlink antenna 72. The data stored in the memory registers 66 are also routed to an adder 74, which adds the stored power level of a certain carrier to the newly computed power level of that carrier from the multiplier 62. Both the adder 74 and the memory registers 66 are controlled by the synchronized timing clock 64, which ensures that a carrier's power level is added to the power level currently stored in the correct memory register for that carrier. By scanning the memory input among the registers in synchronism with scanning the outputs from the registers, an input is applied to only one register at a time, and an output is simultaneously taken from the same register, with the register inputs and outputs both synchronized to the carrier sequence. After the power levels of the individual carriers are summed over a period of time (T), the numbers stored in the each of the memory registers represent the energy of a particular carrier accumulated over T.

Figure 5:
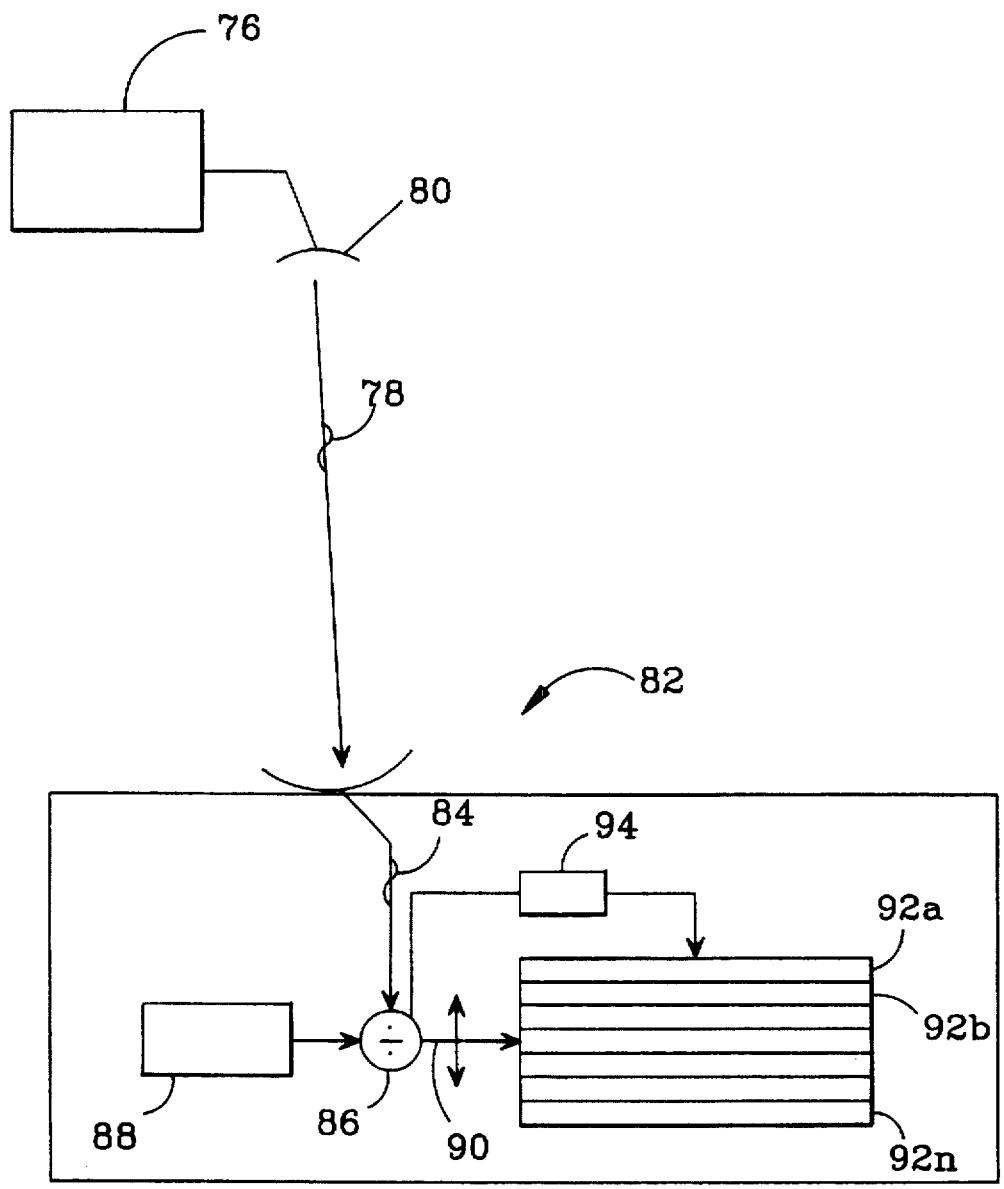
FIG. 5 is a block diagram of a telemetry ground station that receives the power data from a telemetry downlink channel and performs calculations of time-averaged carrier power levels.

The computation of the average power of each carrier over time T can be done either on board the satellite or at a ground station. FIG. 5 shows a preferred embodiment of a time averaging system at a ground station. A satellite 76 transmits the energy data 78 of the carriers to the Earth from an antenna 80. A telemetry ground station 82 receives the telemetered data 84 and sends the data to a divider 86, which divides the number representing the accumulated energy of each carrier by time T 88 to obtain a time-averaged power level 90 for each carrier. The carriers' power levels 90 are sent to an output device, preferably a bank of N memory registers 92a, 92b, . . . 92n which store the time-averaged carrier power levels, one register for each carrier. The memory registers 92a, 92b, . . . 92n and the divider 86 are controlled by a timer 94 which is synchronized with the arrival of each carrier's power level to ensure that each power level is stored in the correct memory register.

While several illustrative embodiments of the invention have been shown and described, numerous variations and alternate embodiments will occur to those skilled in the art. For example, the power monitoring system can be incorporated into the digital processor of a transponder that drives a directional antenna to broadcast the multi-carrier signal. Such variations and alternate embodiments are contemplated, and can be made without departing from the spirit and scope of the invention as defined in the appended claims.

I claim:

1. A satellite transponder communications carrier power monitoring system, comprising:

a receiver for receiving uplink communications signals having a plurality of carriers, each carrier based upon a separate frequency;

an analog-to-digital converter (A/D) connected to said receiver to convert said communications signals into digital signals in a discrete time domain;

a digital time-to-frequency transform processor connected to transform said digital signals in said discrete time domain into discrete frequency samples which represent respective carriers;

a digital signal processing system connected to modify said discrete frequency samples; and an on board carrier power monitor connected to an output of said digital time-to-frequency transform processor to digitally compute the power levels of said carriers.

2. The system of claim 1, wherein said power monitor further comprises:

a power computing circuit connected to compute the powers of said discrete frequency samples from said digital time-to-frequency transform processor;

respective memory registers for said carriers;

an adder connected to add the powers computed by said power computing circuit to the values held in said memory registers; and a timing clock synchronizing each carrier's frequency samples with said memory registers and said adder so that the computed sample powers for each carrier are accumulated in that carrier's memory register at a rate determined by said timing clock.

3. The system of claim 2, further comprising:

a telemetry radio frequency (RF) modulator for converting output data from said memory registers representing the carrier power levels to RF signals for transmission to an Earth station; and a downlink antenna for transmitting said RF signals to an Earth station.

4. The system of claim 2, wherein said power computing circuit comprises a square multiplier connected to multiply the amplitudes of discrete frequency samples by themselves to obtain said power levels.

5. The system of claim 2, further comprising a telemetry station on the Earth, said telemetry station comprising:

a telemetry receiver for receiving said RF signals from on board carrier power monitor;

a divider connected to compute the average power of each carrier from the received RF signals; and an output device for said computed average power.

6. The system of claim 5, wherein said output device comprises a bank of average power memory registers, one register per carrier, for storing time-averaged per carrier power levels, and a timer controlling the application of average power signals for different carriers from said divider to different respective average power memory registers.

7. An on board satellite communications carrier power monitoring system for monitoring the powers of multiple discrete frequency digital carrier signals in the frequency domain, comprising:

a power computing circuit connected to compute the power levels of said discrete frequency digital carrier signals;

a plurality of memory registers, one for each carrier;

an adder connected to add the powers computed by said power computing circuit to the values held in said memory registers; and a timing clock synchronizing each carrier's frequency samples with said memory registers and said adder so that the computed sample powers for each carrier are accumulated in that carrier's memory register at a rate determined by said timing clock.

8. The system of claim 7, wherein said power computing circuit comprises a square multiplier connected to multiply the amplitudes of discrete frequency samples by themselves to obtain said power levels.

9. A method for computing power levels for satellite transponder's individual carriers, comprising:

receiving uplink communications signals having a plurality of carriers, each carrier representing a separate frequency;

converting said signals to digital signals in a time domain;

converting said digital signals in the time domain to discrete frequency samples in a frequency domain, each discrete frequency sample representing a respective carrier;

performing digital signal processing on said discrete frequency samples; and computing the power levels of said carriers from said discrete frequency samples.

10. The method of claim 9, wherein the power levels of said carriers are computed by:

multiplying the amplitude of each carrier's frequency sample by itself at successive time intervals to obtain instantaneous carrier power levels;

accumulating said instantaneous carrier power levels separately for each carrier over a time (T) which encompasses a plurality of said time intervals.

11. The method of claim 9, wherein the accumulated instantaneous power level for each of said carriers is divided by T to obtain a time-averaged power level for each carrier.

12. The method of claim 11, wherein the accumulated instantaneous power level of each carrier is transmitted to an Earth station, and said divide by T operation is performed at said Earth station.

* * * * *